US 8,688,067 B2

(12) United States Patent
Morishita

(10) Patent No.: US 8,688,067 B2
(45) Date of Patent: Apr. 1, 2014

(54) SAMPLING CIRCUIT AND RECEIVER USING SAME

(75) Inventor: Yohei Morishita, Tokyo (JP)

(73) Assignee: Panasonic Corporation, Osaka (JP)

( * ) Notice: Subject to any disclaimer, the term of this patent is extended or adjusted under 35 U.S.C. 154(b) by 216 days.

(21) Appl. No.: 13/120,945

(22) PCT Filed: Dec. 4, 2009

(86) PCT No.: PCT/JP2009/006645
§ 371 (c)(1),
(2), (4) Date: Mar. 25, 2011

(87) PCT Pub. No.: WO2010/064450
PCT Pub. Date: Jun. 10, 2010

(65) Prior Publication Data
US 2011/0183639 A1 Jul. 28, 2011

(30) Foreign Application Priority Data
Dec. 4, 2008 (JP) .................. 2008-310015

(51) Int. Cl.
*H04B 1/26* (2006.01)
*G06G 7/12* (2006.01)
*H03H 15/00* (2006.01)
*G06F 17/17* (2006.01)

(52) U.S. Cl.
USPC ........... 455/319; 455/227; 455/318; 455/320; 455/334; 375/346; 327/355; 327/552; 708/313

(58) Field of Classification Search
USPC .............. 455/323, 130, 137, 141, 143, 165.1, 455/213, 231, 255–260, 262, 307, 318–319, 455/227, 334, 185.1, 339, 73, 76, 313, 324; 708/313, 847, 819; 341/122–125; 375/322, 346, 350, 340, 324; 327/105, 327/552, 91, 237, 355, 551; 333/167
See application file for complete search history.

(56) References Cited

U.S. PATENT DOCUMENTS 6,181,740 B1 * 1/2001 Yasuda .................... 375/232
7,057,540 B2 * 6/2006 Muhammad et al. ........ 341/143
(Continued)

FOREIGN PATENT DOCUMENTS

JP 2008-11493 1/2008

OTHER PUBLICATIONS

International Search Report for corresponding International Application No. PCT/JP2009/006645, mailed Feb. 2, 2010.
R. B. Staszewski et al., "All-Digital TX Frequency Synthesizer and Discrete-Time Receiver for Bluetooth Radio in 130n-nm CMOS", IEEE Journal of Solid-State Circuits, vol. 39, No. 12, Dec. 2004, pp. 2278-2291 (pp. 2284~2287 and FIG.12 to FIG.16 cited in specification).
U.S. Appl. No. 13/119,516 to Yohei Morishita, filed Mar. 17, 2011.
U.S. Appl. No. 13/122,475 to Yohei Morishita et al., filed Apr. 4, 2011.
U.S. Appl. No. 13/121,244 to Yohei Morishita et al., filed Mar. 28, 2011.

*Primary Examiner* — Pablo Tran
(74) *Attorney, Agent, or Firm* — Greenblum & Bernstein, P.L.C.

(57) ABSTRACT

A sampling circuit and a receiver are provided having a high flexibility of filter design and excellent characteristics for removing an interfering wave. Provided also are a sampling circuit and a receiver having a low level of the higher harmonic spurious. The sampling circuit includes a charge sampling circuit, which executes sampling of an input signal, and a plurality of charge sharing circuits connected in parallel to the output stage of the charge sampling circuit. The charge sharing circuits include a charge sharing circuit group having transmission functions different from one another, a synthesis circuit, which is arranged at the output side of the charge sharing circuit group and synthesizes the outputs of the charge sharing circuits, and a digital control unit, which outputs a control signal for controlling the operation of the charge sharing circuit group and the synthesis circuit.

10 Claims, 13 Drawing Sheets

(56) References Cited

U.S. PATENT DOCUMENTS

| | | | |
|---|---|---|---|
| 7,519,135 B2* | 4/2009 | Staszewski et al. | 375/346 |
| 7,539,721 B2* | 5/2009 | Belveze et al. | 708/819 |
| 7,791,407 B2* | 9/2010 | Muhammad et al. | 327/552 |
| 8,112,057 B2* | 2/2012 | Hosokawa et al. | 455/313 |
| 8,179,185 B2* | 5/2012 | Hosokawa et al. | 327/355 |
| 8,229,987 B2* | 7/2012 | Hosokawa et al. | 708/313 |
| 2003/0035499 A1 | 2/2003 | Staszewski et al. | |
| 2005/0104654 A1 | 5/2005 | Muhammad et al. | |
| 2009/0009155 A1 | 1/2009 | Hosokawa et al. | |

\* cited by examiner

US 8,688,067 B2

SAMPLING CIRCUIT AND RECEIVER USING SAME

TECHNICAL FIELD

The present invention relates to a sampling circuit and a receiver, and, more particularly, to a technology to perform received signal processing such as frequency conversion, filter processing and so forth by means of discrete time analog processing.

BACKGROUND ART

A configuration has been known that performs reception processing by means of direct discrete time sampling of a high-frequency signal with the aim of achieving small size and low power consumption of a receiver and integrating the analog signal processing section and digital signal processing section (see, for example, Non-Patent Literature 1 and Patent Literature 1).

FIG. 1 shows the overall configuration of a sampling circuit disclosed in Non-Patent Literature 1 and Patent Literature 1. FIG. 2 is a timing chart showing control signals inputted to the sampling circuit shown in FIG. 1. The sampling circuit shown in FIG. 1 performs frequency conversion on a received analog RF signal using a multi-tap direct sampling mixer to obtain a discrete time analog signal. To be more specific, electrical charge transfer between capacitors included in the sampling circuit in FIG. 1 realizes filter characteristics resulting in the product of an FIR (finite impulse response) filer and an IIR (infinite impulse response) filter. Characteristics around the passband are determined based on second-order IIR filter characteristics. FIGS. 3A and 3B show wideband frequency characteristics and an example of narrowed frequency characteristics in the sampling circuit in FIG. 1, nearby the passband.

CITATION LIST

Patent Literature

PTL 1
U.S. Patent Application Publication No. 2003/0035499, "Direct Radio Frequency Sampling with Recursive Filtering Method"

Non-Patent Literature

NPL 1
R. B. Staszewski; et al. "All-Digital TX Frequency Synthesizer and Discrete-Time Receiver for Bluetooth Radio in 130 n-nm CMOS", IEEE Journal of Solid-State Circuits, VOL. 39, No. 12, December 2004 (p 2284-2287, FIG. 12 to FIG. 16)

SUMMARY OF INVENTION

Technical Problem

However, the above-described prior art has the following problems.

First, in the conventional sampling circuit shown in FIG. 1, characteristics around the passband shown in FIG. 3B are determined based on second-order IIR filter characteristics, so that, if the sampling circuit is attempted to a wideband radio communication system, it is not possible to obtain satisfactory frequency response characteristics. To be more specific, if a sampling circuit having the filter characteristic shown in FIG. 3B is attempted to be applied to a radio communication system in which signals in a neighboring channel and other interfering waves exist nearby the band to receive signals, it is not possible to fully attenuate interfering waves, and gain variations occur in the band to receive signals.

In addition, with the configuration shown in FIG. 1, there are only three kinds of capacitance values of history capacitor 3, rotate capacitors 4a to 4h and buffer capacitor 5, which are circuit element values contributing to change in frequency response characteristics of filtering in the sampling circuit. Therefore, characteristics obtained by changing these circuit element values are limited, so that it is not possible to flexibly design filter characteristics.

For example, when it is desired to realize frequency response characteristics to secure a greater amount of attenuation for cancelling interfering waves nearby the receiving channel band, it is possible to achieve the frequency response characteristics by increasing the ratio of capacitance values between history capacitor 3 and rotate capacitors 4a to 4h. However, this causes increase in gain variations in the band to receive signals. By contrast with this, when the amount of gain variations in the band to receive signals is attempted to be reduced, it is not possible to secure the amount of attenuation for interfering waves.

As described above, the above-described sampling circuit has a problem that it is not possible to both secure attenuation characteristics in the interfering wave area and reduce the amount of gain variations in the band to pass received signals.

Moreover, the conventional sampling circuit shown in FIG. 1 has a problem of a third-order harmonic response shown in FIG. 3A, because, basically, the frequency of an analog RF signal is converted by multiplying an LO signal formed as a rectangular wave, by an analog RF signal. Here, the third-order harmonic response refers to an unnecessary signal that falls in baseband by the product of a component k=1 of a rectangular local (LO) signal and on input signal.

$$f(t) = \frac{4}{\pi} \sum_{k=0}^{\infty} \frac{1}{2k+1} \sin(2k+1)\omega_{LO} t \qquad [1]$$

FIG. 3A shows an example of frequency characteristics when the local (LO) frequency is 1 GHz, the horizontal axis represents an input RF signal frequency and the vertical axis represents output signal amplitude after frequency conversion. In FIG. 3A, the third-order harmonic response refers to the output amplitude of an input RF signal of 3 GHz, and achieves a great gain of about 20 dB.

It is therefore an object of the present invention to provide a sampling circuit and a receiver having a high flexibility of filter design and excellent interfering wave cancellation characteristics, and provide a sampling circuit and a receiver having a low harmonic spurious level.

Solution to Problem

The sampling circuit according to the present invention adopts a configuration to include: an electrical charge sampling circuit that samples an input signal; a group of electrical charge sharing circuits composed of a plurality of electrical charge sharing circuits connected to an output stage of the electrical charge sampling circuit, the plurality of electrical charge sharing circuits having different transfer functions or different operating frequencies; a synthesis circuit that is provided in an output side of the group of electrical charge sharing circuits and synthesizes outputs from the plurality of electrical charge sharing circuits; and a digital control unit that outputs control signals to control operation of the group of electrical charge sharing circuits and operation of the synthesis circuit.

Advantageous Effects of Invention

According to the present invention, by providing a plurality of discrete time analog processing circuits having different transfer functions, it is possible to increase the kinds of parameters which can be set in the circuit, so that it is possible to design filter characteristics to freely set the positions of attenuation poles and to reduce in-band deviation in the passband and it is possible to realize wideband filter characteristics and excellent interfering wave cancelling characteristics.

Moreover, according to the present invention, it is possible to reduce unnecessary harmonic responses by synthesizing discrete time analog processing circuits operating at different speeds.

DESCRIPTION OF EMBODIMENTS

Figure 1:
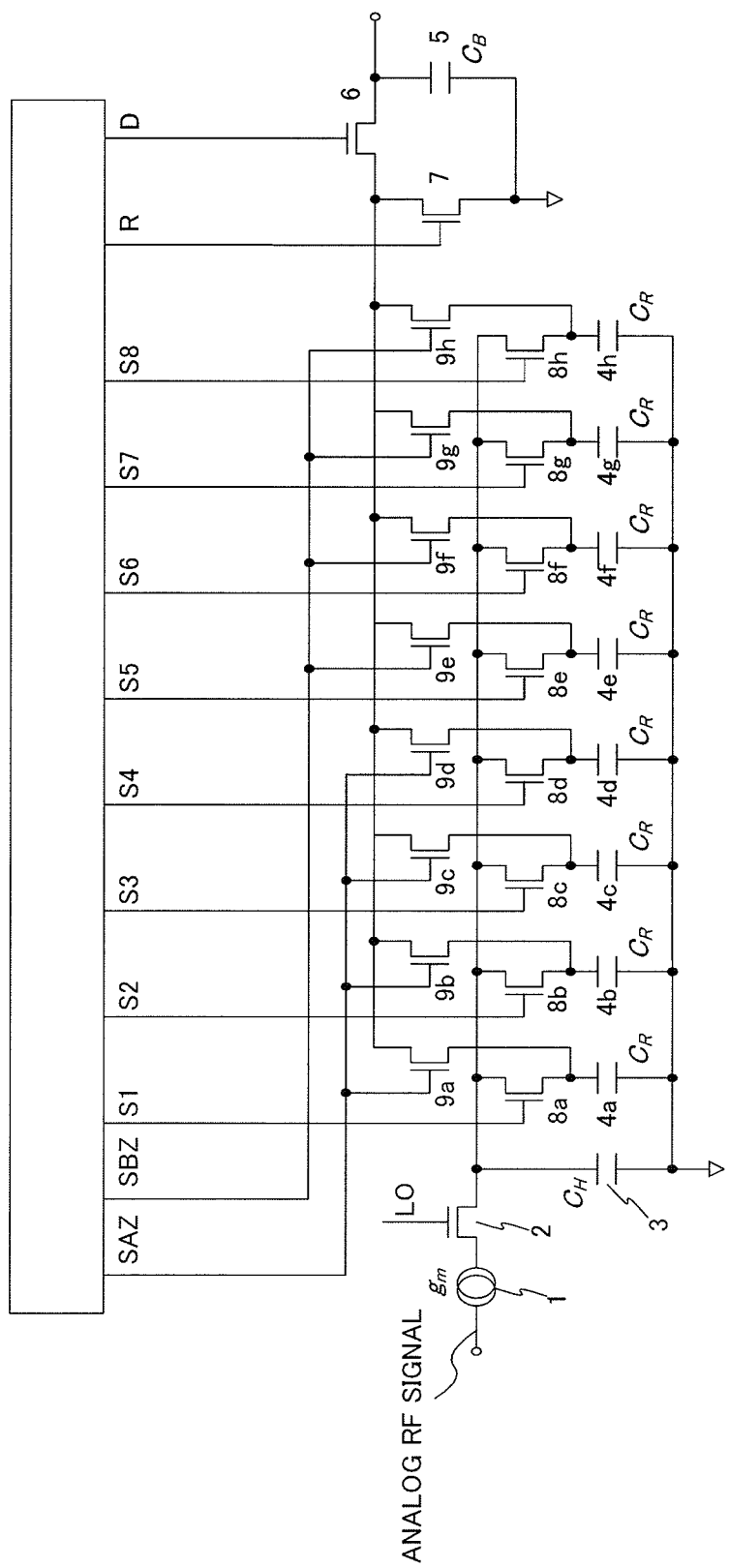
FIG. 1 is a connection diagram showing an example of a configuration of a conventional sampling circuit.
Figure 2:
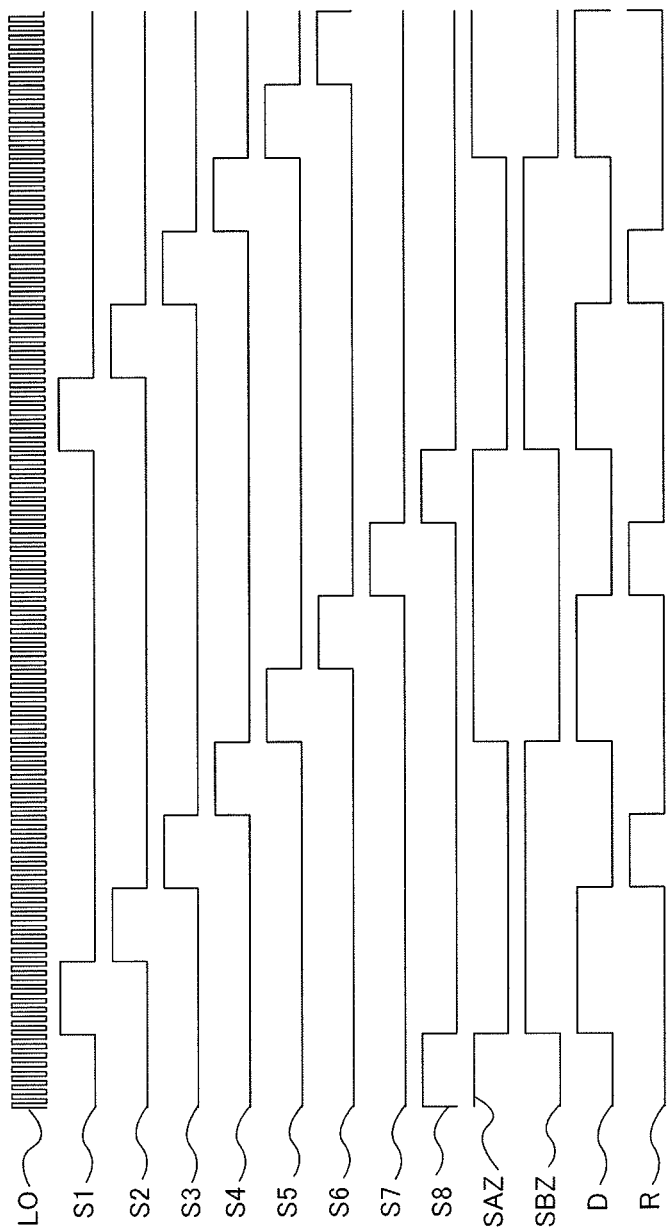
FIG. 2 is a timing chart explaining control signals in the conventional sampling circuit.
Figure 3B:
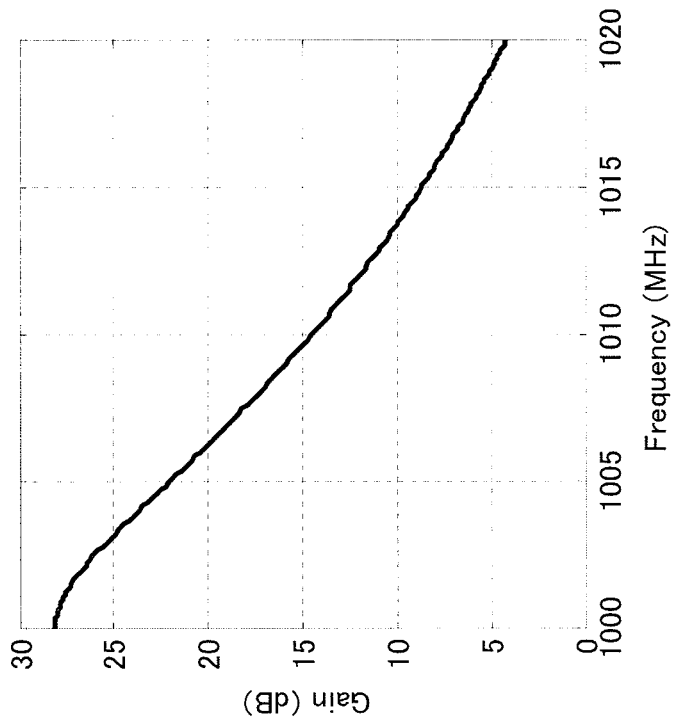
FIG. 3 is a characteristic diagram showing examples of filter characteristics realized in the conventional sampling circuit.
Figure 3A:
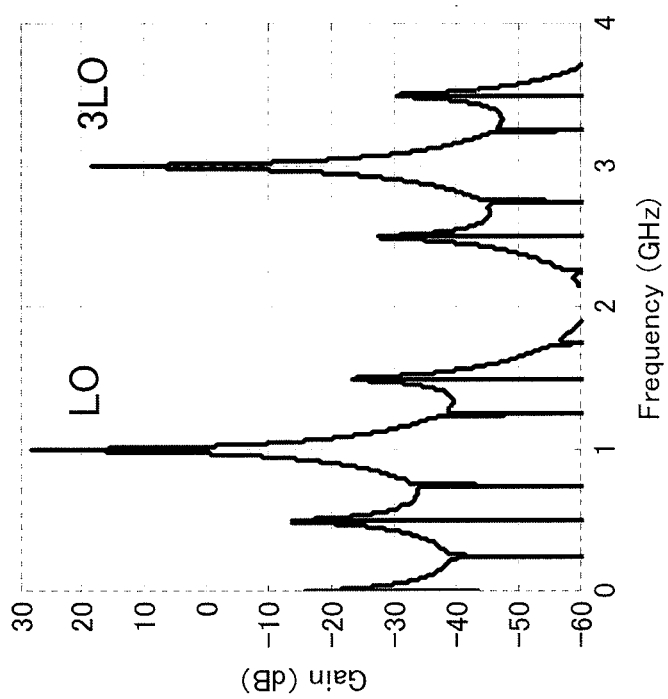

Now, embodiments of the present invention will be described in detail with reference to the accompanying drawings. By simply arranging, in parallel, two or more conventional sampling circuits as shown in FIG. 1, it is possible to realize filter characteristics resulting from adding respective transfer functions of the sampling circuits. For example, when two sampling circuits are arranged in parallel, the following transfer function is obtained, as the whole circuit.

(Equation 1)

$$T = \frac{a_1}{b_1 + 1 - z^{-M}} + \frac{a_2}{b_2 + 1 - z^{-M}} = \frac{a_1(b_2 + 1) + a_2(b_1 + 1) - (a_1 + a_2)z^{-M}}{(b_1 + 1 - z^{-M})(b_2 + 1 - z^{-M})} \quad [2]$$

Here, on order to improve interference wave cancellation capability, it is necessary to satisfy equation 2 with a condition of equation 1=0 to include attenuation poles in equation 1.

(Equation 2)

$$z^{-M} = e^{-jM\omega T_S} = \cos(M\omega T_S) - j\sin(M\omega T_S) = \frac{a_1(b_2 + 1) + a_2(b_1 + 1)}{(a_1 + a_2)} = \text{(a real number)} \quad [3]$$

Here, $T_S$ is a sampling period, and, if the frequency of sampling is $f_S$, $T_S=1/f_S$. In addition, if direct sampling is applied to an RF input signal, the local (LO) signal frequency corresponds to the sampling frequency, so that $f_S=f_{LO}$.

However, with the configuration shown in FIG. 1, it is possible to realize only a and b in equation 1 as real numbers, and therefore equation 2 is a real number by necessity, so that $\sin(M\omega T_S)$ should be zero. If so, it is necessary to satisfy $M\omega T_S=n\pi(n=0, 1, 2, \ldots)$. That is, it is not possible to generate attenuation poles only in frequencies of n/(2M) multiples of sampling frequency $f_S$. That is, it is understood that it is not possible to freely control the frequency of an attenuation pole by simply placing two sampling circuits in parallel. Therefore, the inventors have found that it is possible to freely control the frequency of an attenuation pole with configurations described later.

Embodiment 1

Figure 4:
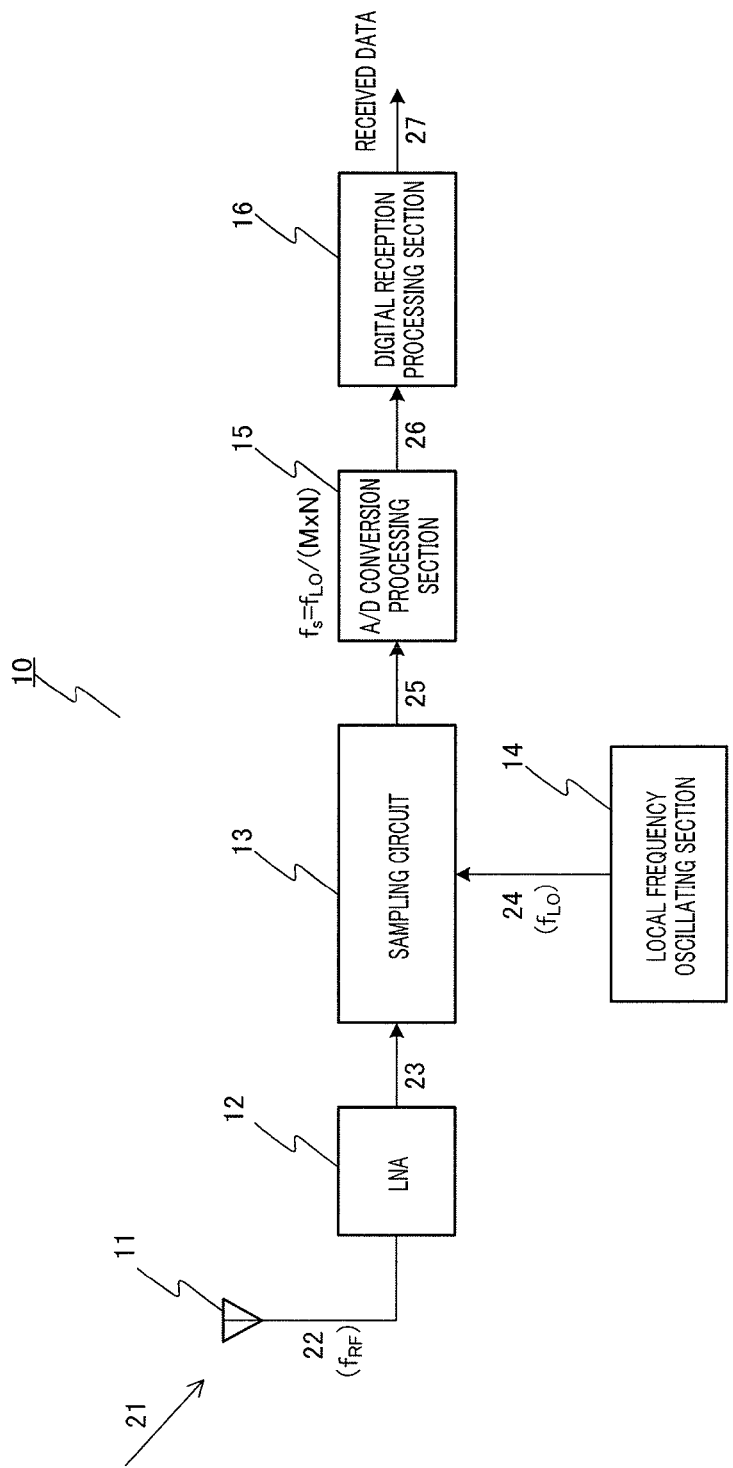
FIG. 4 is a block diagram showing a configuration of a sampling receiver according to Embodiment 1 of the present invention.

FIG. 4 shows the configuration of a sampling receiver according to the present embodiment. Discrete time sampling receiver 10 has antenna 11, LNA (low noise amplifier) 12, sampling circuit 13, local frequency oscillating section 14, A/D (analog-to-digital) conversion processing section 15 and digital reception processing section 16.

This sampling receiver 10 receives electromagnetic wave 21 transmitted at carrier frequency $f_{RF}$, and applies discrete-time frequency conversion and filter processing on this received signal to extract a desired signal component. Then, sampling receiver 10 performs digital reception processing by converting the extracted desired signal component to a digital signal, and outputs resultant received data 27.

Antenna 11 receives electromagnetic wave 21 transmitted at carrier frequency ($f_{RF}$) from a transmitting station (not shown) and converts it to analog RF signal 22. LNA 12 amplifies analog RF signal 22 and outputs the result.

Amplified analog RF signal 23 and local frequency signal 24 are inputted to sampling circuit 13. Then, sampling circuit 13 performs filter processing by performing discrete-time frequency conversion on analog RF signal 23 using local frequency signal ($f_{LO}$) 24 to obtain baseband signal 25 only with a desired signal component, and outputs baseband signal 25.

Local frequency oscillating section 14 generates local frequency signal ($f_{LO}$) 24 used in sampling processing and frequency conversion processing, and outputs it to sampling circuit 13.

Analog-to-digital conversion processing section 15 quantizes an inputted baseband signal into digital values at a predetermined sampling frequency and outputs digital baseband signal 26 having been converted to a digital signal.

Digital reception processing section 16 performs predetermined digital reception processing, including demodulation, decoding and so forth, on inputted digital baseband signal 26, and outputs resultant reception data 27.

(Summary of Sampling Circuit)

Figure 5:
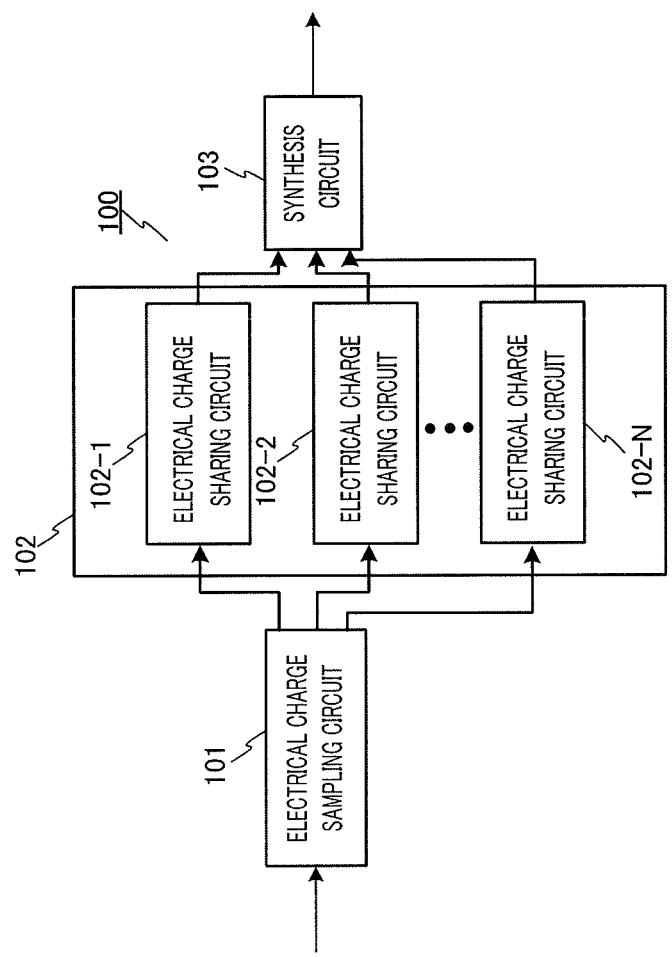
FIG. 5 is a block diagram showing a configuration of a sampling circuit according to Embodiment 1.

FIG. 5 shows the configuration of sampling circuit 13 in FIG. 4. Sampling circuit 100 in FIG. 5 is equivalent to sampling circuit 13 in FIG. 4. Now, sampling circuit 100 will be explained using FIG. 5.

Electrical charge sampling circuit 101 performs frequency conversion on a received high-frequency signal to obtain a baseband signal by switching a current signal. Electrical charge sharing circuit group 102 is composed of electrical charge sharing circuits 102-1 to 102-N (N is a natural number equal to or more than 2), each of which has a passive circuit configuration including a switch and a capacitor. Synthesis circuit 103 synthesizes outputs from electrical charge sharing circuits 102-1 to 102-N.

Here, transfer functions may be vary between electrical charge sharing circuits 102-1 to 102-N, and outputs from electrical charge sharing circuits 102-1 to 102-N are finally synthesized in synthesis circuit, so that it is possible to realize a required filter characteristic. Here, electrical charge sampling circuit 101 is not an essential component, and it is possible to simply use electrical charge sharing circuits as a discrete time filter.

Now, an example will be explained where it is possible to obtain the transfer function represented by equation 5 if electrical charge sharing circuit 102-1 has the transfer function represented by equation 3, electrical charge sharing circuit 102-2 has the transfer function represented by equation 4, and outputs from electrical charge sharing circuit 102-1 and electrical charge sharing circuit 102-2 are synthesized.

(Equation 3)

$$T_1 = \frac{a_1}{b_1 + 1 - z^{-M}} \quad [4]$$

(Equation 4)

$$T_2 = \frac{a_2 + a_3 z^{-M}}{b_2 + 1 - z^{-M}} \quad [5]$$

(Equation 5)

$$T = T_1 + T_2 \quad [6]$$

(The Specific Configuration of a Sampling Circuit)

Figure 6:
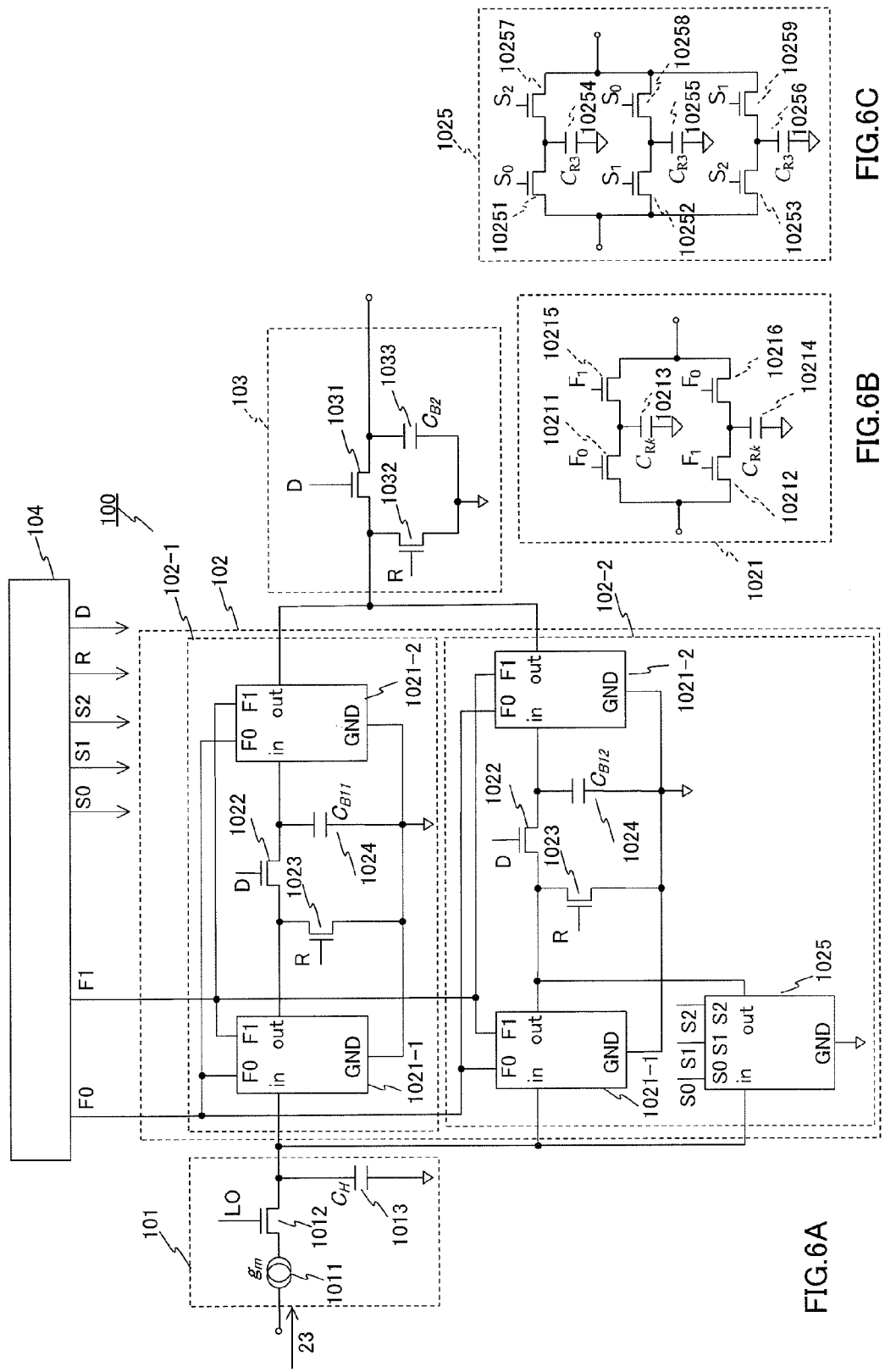
FIG. 6 is a connection diagram showing the configuration of the sampling circuit according to Embodiment 1.

FIG. 6 shows the specific configuration of the above-described sampling circuit 100 in FIG. 5. Here, a case will be explained in which the number of electrical charge sharing circuits 102-1 to 102-N is 2 (N=2).

As shown in FIG. 6A, it is possible to roughly divide sampling circuit 100 into (1) electrical charge sampling circuit 101, (2) electrical charge sharing circuit group 102, (3) synthesis circuit 103 and (4) digital control unit 104.

Here, each of (1) electrical charge sampling circuit 101, (2) electrical charge sharing circuit group 102, (3) synthesis circuit 103 and (4) digital control unit 104 has the following configuration.

(1) Electrical charge sampling circuit 101 is composed of TA (transconductance amplifier) 1011, sampling switch 1012 and history capacitor 1013.

(2) Charge sharing circuit group 102 is composed of a plurality of electrical charge sharing circuits 102-1 and 102-2 connected in parallel to the output stage in electrical charge sampling circuit 101. Each of electrical charge sharing circuits 102-1 and 102-2 is composed of rotate capacitor unit 1021, dump switch 1022, reset switch 1023 and buffer capacitor 1024.

(3) Synthesis circuit 103 is provided in the output side of electrical charge sharing circuit group 102 and synthesizes outputs from a plurality of electrical charge sharing circuits 102-1 to 102-2. Synthesis circuit 103 is composed of dump switch 1031, reset switch 1032 and buffer capacitor 1033.

(4) Digital control unit 104 generates and outputs control signals to each switch to control operation of electrical charge sharing circuit group 102 and synthesis circuit 103.

Electrical charge sharing circuit 102-1 has rotate capacitor unit 1021-1 and 1021-2. Rotate capacitor units 1021-1 and 1021-2 have the same configuration. Therefore, hereinafter, rotate capacitor units 1021-1 and 1021-2 may be collectively referred to as rotate capacitor unit 1021 for ease of explanation. Rotate capacitor unit 1021 has the configuration of rotate capacitor units 1021-1 and 1021-2. As shown in FIG. 6B, rotate capacitor unit 1021 has integration switches 10211 and 10212, rotate capacitors 10213 and 10214, and release switches 10215 and 10216. Then, dump switch 1022, reset switch 1023 and buffer capacitor 1024 are connected between rotate capacitor unit 1021-1 and rotate capacitor unit 1021-2.

In addition, among control signals generated in digital control unit 104, control signal F0 is supplied to integration switch 10211 and release switch 10216, and control signal F1 is supplied to integration switch 10212 and release switch 10215. Control signal D is supplied to dump switch 1031, and control signal R is supplied to reset switch 1032.

On the other hand, electrical charge sharing circuit 102-2 has another rotate capacitor unit 1025, in addition to rotate capacitor units 1021-1 and 1021-2. The configuration of rotate capacitor units 1021-1 and 1021-2 is the same as that of rotate capacitor unit 1021 in electrical charge sharing circuit 102-1. As shown in FIG. 6C, rotate capacitor unit 1025 has integration switches 10251, 10252 and 10253, rotate capacitors 10254, 10255 and 10256, and release switches 10257, 10258 and 10259. Then, dump switch 1022, reset switch 1023 and buffer capacitor 1024 are connected between rotate capacitor unit 1021-1 and rotate capacitor unit 1021-2.

In addition, among control signals generated in digital control unit 104, control signal F0 is supplied to integration switch 10211 and release switch 10216, and control signal F1 is supplied to integration switch 10212 and release switch 10215. Control switch S0 is supplied to integration switch 10251 and release switch 10258 in rotate capacitor unit 1025. Control signal S1 is supplied to integration switch 10252 and release switch 10259. Control signal S2 is supplied to integration switch 10253 and release switch 10257. Control signal D is supplied to dump switch 1031 and control signal R is supplied to reset switch 1032.

Here, the capacitance values of rotate capacitors 10213, 10214, 10254, 10255 and 10256 are set to provide desired characteristics in each of electrical charge sharing circuits 102-1 and 102-2.

Next, synthesis circuit 103 has dump switch 1031, reset switch 1032 and buffer capacitor 1033. Although synthesis circuit 103 may have a configuration to share electrical charge using buffer capacitor shown in FIG. 6, the configuration is by no means limiting. For example, it is possible to prepare the same number of buffer capacitors 1033 as the number of parallel electrical charge sharing circuits 102-1 to 102-n, and output signals by means of an adding circuit using an operational amplifier.

Here, the present invention does not limit what circuit configuration after buffer capacitor 1033 is. For example, a circuit configuration is possible where a discrete signal value defined by the amount of electrical charge accumulated in buffer capacitor 1033 is quantized into a digital value while sampling and holding the discrete signal value as is, and then digital signal processing is performed. In addition, for example, another configuration is possible where a discrete signal value defined by the amount of electrical charge accumulated in buffer capacitor 1033 is purposely converted to a voltage, and then signal processing is performed.

Digital control unit 104 generates and supplies control signals to integration switches 10211 and 10212, release switches 10215 and 10216, dump switches 1022 and 1031, and reset switches 1023 and 1032 in rotate capacitor unit 1021 and synthesis circuit 103.

Figure 7:
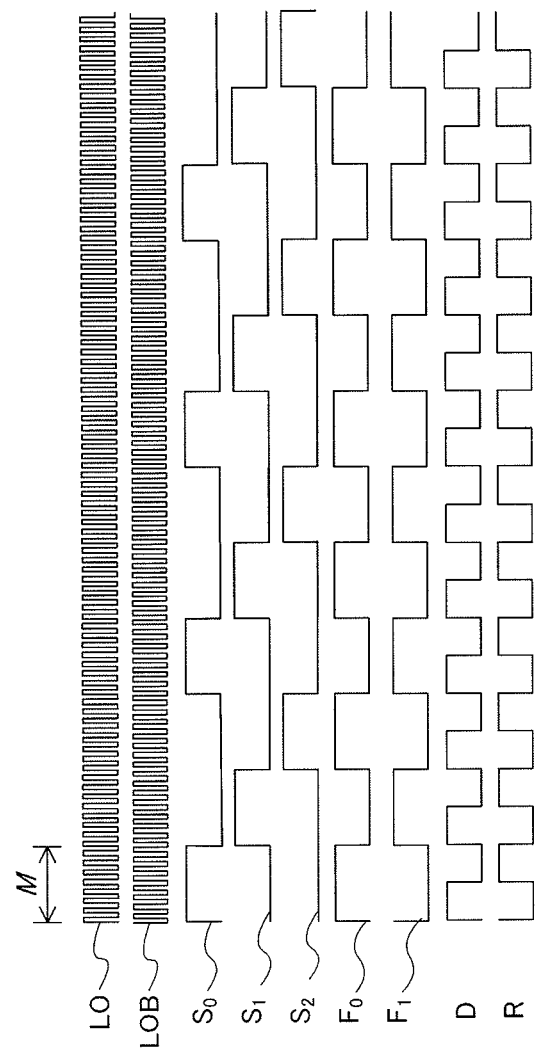
FIG. 7 is a timing chart explaining control signals according to Embodiment 1.

FIG. 7 is a timing chart showing control signals outputted from digital control unit 104, and local frequency signals supplied to sampling switch 1012. Control signal F0 and control signal F1 have high level periods shifted from one another, and the duration of the high level of each signal matches M periods of local frequency signal LO. Also control signals S0, S1 and S2 have high level periods shifted from each other, and the duration of the high level of each signal matches M periods of local frequency signal LO.

Here, although with the present embodiment, a configuration is possible in which additionally, capacitors for feedback control and control signals therefor used, illustration and description of capacitors for feedback is omitted for ease of explanation.

(Operation of a Sampling Circuit)

Next, operation of sampling circuit 100 according to the present embodiment will be explained.

First, TA (transconductance amplifier) 1011 converts inputted analog RF signal 23 to an analog RF current signal. Sampling switch 1012 samples the analog RF current signal using local frequency signal 24 having approximately the same frequency LO as the analog RF current signal and outputs a sampled signal.

Here, the electrical charge of the sampled signal is integrated using history capacitor 1013, rotate capacitor 10213 or 10214 in rotate capacitor unit 1021, and rotate capacitors 10254, 10255 or 10256 to form a discrete time signal. Moreover, integration switch 10211 or 10212 and integration switch 10251, 10252 or 10253 are controlled on and off between history capacitor 1013 and rotate capacitor 10213 or 10214, and between history capacitor 1013 and rotate capacitor 10254, 10255 or 10256, so that it is possible to realize a filter characteristic matching an FIR filter. Here, the FIR filter characteristic is defined by the time length for which each of control signals F0 and F1 is in the high level, that is, the time length in which electrical charge integration between history capacitor 1013 and rotate capacitor 10213 or 10214, and between history capacitor 1013 and rotate capacitor 10254, 10255 or 10256 by electrical charging.

Here, electrical charge sharing circuit 102-1 and electrical charge sharing circuit 102-2 have different structures. Electrical charge accumulated in rotate capacitors 10213, 10214, 10254, 10255 and 10256 in electrical charge sharing circuits 102-1 and 102-2 are shared through different routes, so that electrical charge sharing circuits 102-1 and 102-2 perform discrete-time processing having different transfer functions from one another.

In electrical charge sharing circuit 102-1, the electrical charge accumulated in rotate capacitor 10213 or 10214 in rotate capacitor unit 1021-1 is shared between buffer capacitor 1024 and rotate capacitor 10213 or 10213 in rotate capacitor unit 1021-2, via dump switch 1022 and integration switch 10211 or 10212 in rotate capacitor unit 1021-2. Buffer capacitor 1024 holds the electrical charge after electrical charge sharing one timing before, as a state before electrical charge, so that first-order filtering is performed in the whole electrical charge sharing circuit 102-1. Here, F0 and F1 have inverse characteristics as shown in FIG. 7, so that rotate capacitors 10213 and 10214 are used in turn.

During control signal F0 being in a high level period, in electrical charge sharing circuit 102-1, the electrical charge accumulated in rotate capacitor unit 10213 in rotate capacitor unit 1021-1 is shared between buffer capacitor 1024 and rotate capacitor 10214 in rotate capacitor unit 1021-2, via release switch 10215 in rotate capacitor unit 1021-1 and dump switch 1022 and integration switch 10212 in rotate capacitor unit 1021-2. Buffer capacitor 1024 holds the electrical charge after electrical charge sharing one timing before, as the initial state before electrical charge sharing, so that first-order IIR filtering is performed.

Meanwhile, during F1 being in a high level period, the electrical charge accumulated in rotate capacitor 10214 in rotate capacitor unit 1021-1 is shared between buffer capacitor 1024 and rotate capacitor 10213 in rotate capacitor unit 1021-2.

In parallel with the operation of electrical charge sharing circuit 102-1, the following operation is performed in electrical charge sharing circuit 102-2. During F0 being in a high level period, in charge sharing circuit 102-2, the electrical charge accumulated in rotate capacitor 10213 in rotate capacitor unit 1021-1 and the electrical charge accumulated in rotate capacitor 10254, 10255 or 10256 in rotate capacitor unit 1025 are shared between buffer capacitor 1024 and rotate capacitor 10214 in rotate capacitor unit 1021-2, via release switch 10215 in rotate capacitor unit 1021-1, release switch 10257, 10258 or 10259 in rotate capacitor unit 1025, dump switch 1022, and integration switch 10212 in rotate capacitor unit 1021-2. Buffer capacitor 1024 holds the electrical charge after electrical charge sharing one timing before, as the initial state of electrical charge sharing, so that first-order IIR filtering is performed in the whole electrical charge sharing circuit 102-2.

During control signal F1 being in a high level period, electrical charge is shared among rotate capacitor 10214 in rotate capacitor unit 1021-1, rotate capacitor 10254, 10255 and 10256 in rotate capacitor unit 1025, buffer capacitor 1024 and rotate capacitor 10213 in rotate capacitor unit 1021-2.

At this time, it is important that, while control signals F0 and F1 are inputted to rotate capacitor unit 1021 and rotate capacitors 10213 and 10214 are used in turn, S0, S1 and S2 are inputted to rotate capacitor unit 1025 and rotate capacitors 10254, 10255 and 10256 are used in turn. This results in an increase in the order of the transfer function in the rotate capacitor unit 1025 side.

Next, operation of synthesis circuit 103 is as follows.

During control signal F1 being in a high level period, in electrical charge sharing circuit 102-1, the electrical charge accumulated in rotate capacitor 10213 in rotate capacitor unit 1021-2 is shared with buffer capacitor 1033 via release switch 10215 in rotate capacitor unit 1021-2 and dump switch 1031 to determine the output voltage. Buffer capacitor 1033 has the electrical charge after electrical charge sharing one timing before, as the initial state of electrical charge sharing, so that first-order IIR filtering is performed.

During control signal being in a high level period, rotate capacitor 10214 in rotate capacitor unit 1021-2 and buffer capacitor 1033 share electrical charge to determine the output voltage.

It is possible to describe the transfer function of the entire sampling circuit shown in FIG. 6A as the following equation.

(Equation 6)

$$T = \frac{1-z^{-M}}{1-z^{-1}} \cdot \frac{\pi \sum_{k=1}^{3} C_{Rk}}{\pi \sum_{k=1}^{3} C_{Rk} + C_H(1-z^{-M})} \cdot T_p \cdot \frac{C_{R21}+C_{R22}}{C_{R21}+C_{R22}+C_{B2}(1-z^{-M})} \quad [7]$$

(Equation 7)

$$T_p = \frac{g_m T_{LO}}{(C_{R21}+C_{R22})\pi \sum_{k=1}^{3} C_{Rk}} \left( \frac{\frac{C_{R1}C_{R21}}{C_{R1}+C_{R21}+C_{B11}(1-z^{-M})} +}{\frac{C_{R22}(C_{R2}+C_{R3}z^{-M})}{C_{R2}+C_{R3}+C_{R22}+C_{B12}(1-z^{-M})}} \right) \quad [8]$$

Here, in equation 6, $T_{LO}$ is the period of sampling with a local signal frequency LO in sampling switch 1012. In addition, $g_m$ is the transconductance value of TA (transconductance amplifier) 1011. $C_{R1}$ is the capacitance value of rotate capacitors 10213 and 10214 in rotate capacitor unit 1021-1 in electrical charge sharing circuit 102-1. $C_{R2}$ is the capacitance value of rotate capacitors 10213 and 10214 in rotate capacitor unit 1021-1 in electrical charge sharing circuit 102-2. $C_{R3}$ is the capacitance value of rotate capacitors 10254, 10255 and 10256 in rotate capacitor unit 1025 in electrical charge sharing circuit 102-2. $C_{R21}$ is the capacitance value of rotate capacitors 10213 and 10214 in rotate capacitor unit 1021-2 in electrical charge sharing circuit 102-1. $C_{R22}$ is the capacitance value of rotate capacitors 10213 and 10214 in rotate capacitor unit 1021-2 in electrical charge sharing circuit 102-2.

It is understood that equation 7 is a transfer function corresponding to equation 5. It is possible to determine circuit element values by determining coefficient values in the transfer function of equation 5 to provide required frequency characteristics and comparing equation 5 with equation 7.

Here, it is important that in the transfer function represented by equation 7, if circuit element values are simply set at random, it is not possible to produce desired filter frequency response characteristics. With a double cascade configuration, that is, a configuration in which each of electrical charge sharing circuits 102-1 and 102-2 has rotate capacitor units 1021-1 and 1021-2 to share electrical charge twice, it is possible to realize equation 7 using only one TA (transconductance amplifier) 1011. Here, this is by no means by limiting, and it is possible to realize equation 7 with another configuration in which, for example, a plurality of TAs (transconductance amplifiers) are used, or in which the phase of the clock is shifted between electrical charge sharing circuits 102-1 and 102-2 (a polyphase configuration).

Here an example of a method of determining coefficients in equation 5. As described above, it is not possible to set attenuation poles in random frequency positions with a configuration in which two circuits having the same transfer function are simply arranged in parallel. However, if a configuration in which two or more circuits having different transfer functions are arranged in parallel is adopted, it is possible to realize the sum of the different transfer functions for the whole circuit as shown in equation 5 and therefore to set attenuation poles in random frequency positions.

It is possible to derive coefficient values of the transfer function having an attenuation pole in random frequency $\omega_N$ from the following equation. Here, for example, assume that $b_2 = 1b_1$, and A, 1, $b_1$ are any positive real numbers, it is possible to calculate $a_1$, $a_2$ and $a_3$.

(Equation 8)

$$\begin{bmatrix} a_1 \\ a_2 \\ a_3 \end{bmatrix} = \begin{bmatrix} b_2+1- & b_1+1- & (b_1+1)\cos(M\omega_N T_{LO})- \\ \cos(M\omega_N T_{LO}) & \cos(M\omega_N T_{LO}) & \cos(2M\omega_N T_{LO}) \\ \sin(M\omega_N T_{LO}) & \sin(M\omega_N T_{LO}) & -(b_1+1)\sin(M\omega_N T_{LO})+ \\ & & \sin(2M\omega_N T_{LO}) \\ 1/b_1 & 1/b_2 & 1/b_3 \end{bmatrix}^{-1} \begin{bmatrix} 0 \\ 0 \\ A \end{bmatrix} \quad [9]$$

When $a_1$, $a_2$ and $a_3$ are calculated as positive numbers as the result of calculation using equation 8, it is possible to calculate circuit element values by comparing equation 5 with equation 7.

When the above described calculation method, at least one of $a_1$, $a_2$ and $a_3$ may often be calculated as a negative number. For example, when $a_3$ is calculated as a negative number, it is not possible to realize negative capacitance, so that it is necessary to change the circuit configuration to implement equation 9 by changing the positive coefficient in the numerator in equation 7 to the negative coefficient.

(Equation 9)

$$T_p = \frac{g_m T_{LO}}{(C_{R21}+C_{R22})\pi \sum_{k=1}^{3} C_{Rk}} \left( \frac{\frac{C_{R1}C_{R21}}{C_{R1}+C_{R21}+C_{B11}(1-z^{-M})} +}{\frac{C_{R22}(C_{R2}-C_{R3}z^{-M})}{C_{R2}+C_{R3}+C_{R22}+C_{B12}(1-z^{-M})}} \right) \quad [10]$$

Figure 8:
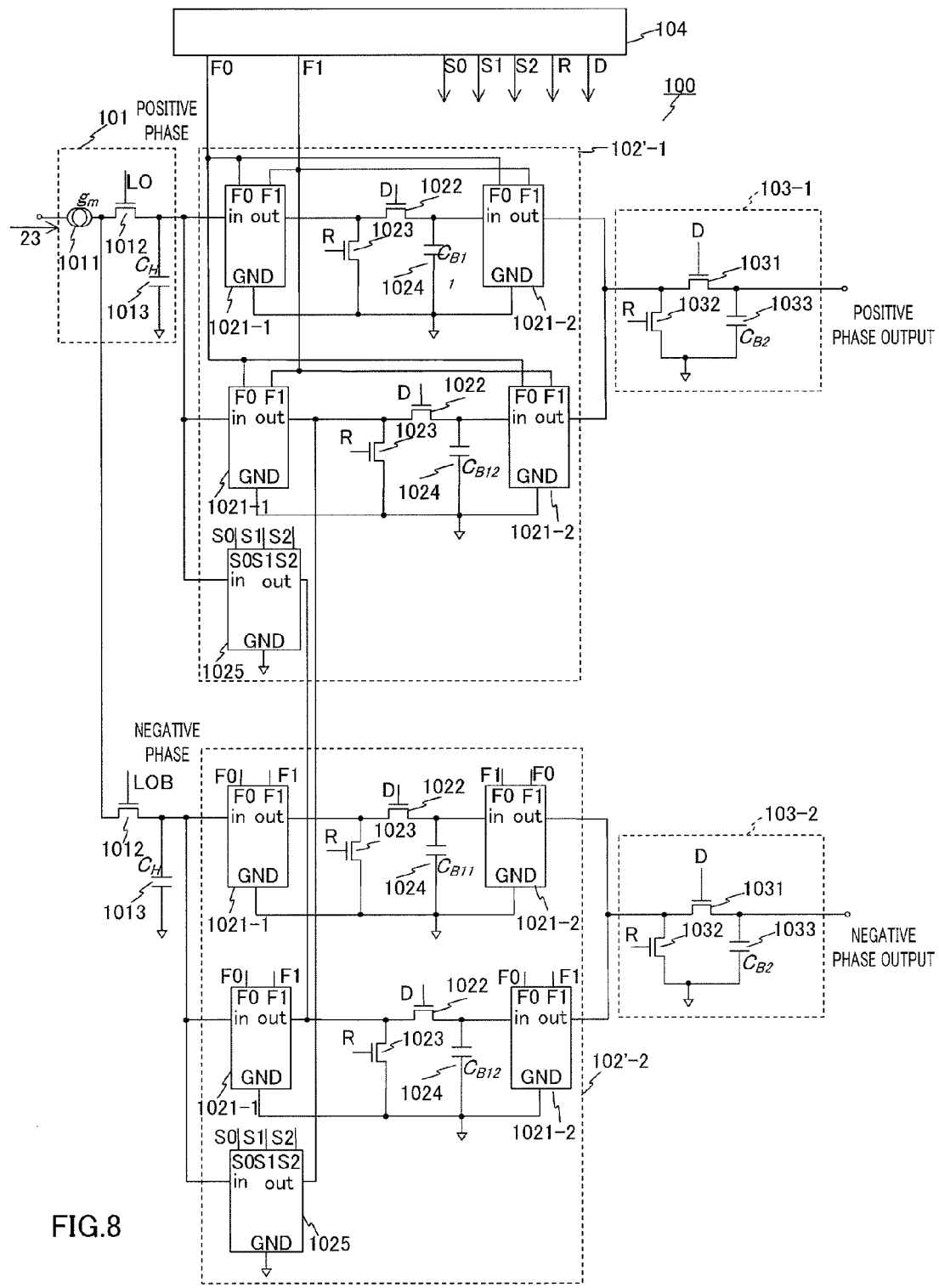
FIG. 8 is a connection diagram showing a configuration to realize negative coefficients of a transfer function are realized in the sampling circuit according to Embodiment 1.

FIG. 8 shows an example of this equation implementation method. In FIG. 8, the circuit shown in FIG. 6 is doubled, and LO signals (LO and LOB in FIG. 7) having phases shifted from one another by a half period are inputted to respective circuit to make positive-phase electrical charge sharing circuit 102'-1 and negative-phase electrical charge sharing circuit 102'-2. Here, in positive-phase electrical charge sharing circuit 102'-1 and negative-phase electrical charge sharing circuit 102'-2 shown in FIG. 8, the same component as in FIG. 6 are assigned the same reference numerals.

In order to realize coefficients in equation 8, the output of rotate capacitor unit 1025 in positive-phase electrical charge sharing circuit 102'-1 is connected to the output of rotate capacitor units 1021-1 in negative-phase electrical charge sharing circuit 102'-2, and the output of rotate capacitor unit 1025 in negative-phase electrical charge sharing circuit 102'-2 is connected to the output of rotate capacitor unit 1021-1 positive-phase electrical charge sharing circuit 102'-1.

In addition, by obtaining the output from positive-phase synthesis circuit 103-1 and the output from negative-phase synthesis circuit 103-2 at the same time as differential output, it is possible to realize a transfer function of equation 9.

Moreover, it is possible to determine circuit element values by comparing equation 5 with equation 9. Here, in the configuration of positive-phase synthesis circuit 103-1 and the configuration of negative-phase synthesis circuit 103-2 shown in FIG. 8, the same components as in FIG. 6 are assigned the same reference numerals.

If any negative coefficient is generated as the result of calculation of equation 8 in addition to $a_3$, the output of the rotate capacitor unit corresponding to that negative coefficient is switched between the negative-phase and the positive-phase, so that it is possible to realize a negative coefficient in the transfer function.

Figure 9B:
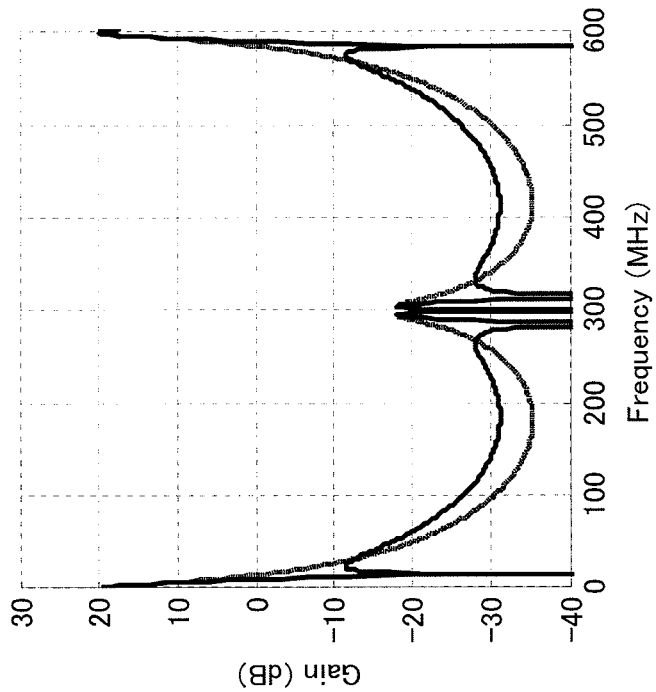
FIG. 9 is a characteristic diagram showing examples of filter characteristics realized according to Embodiment 1.
Figure 9A:
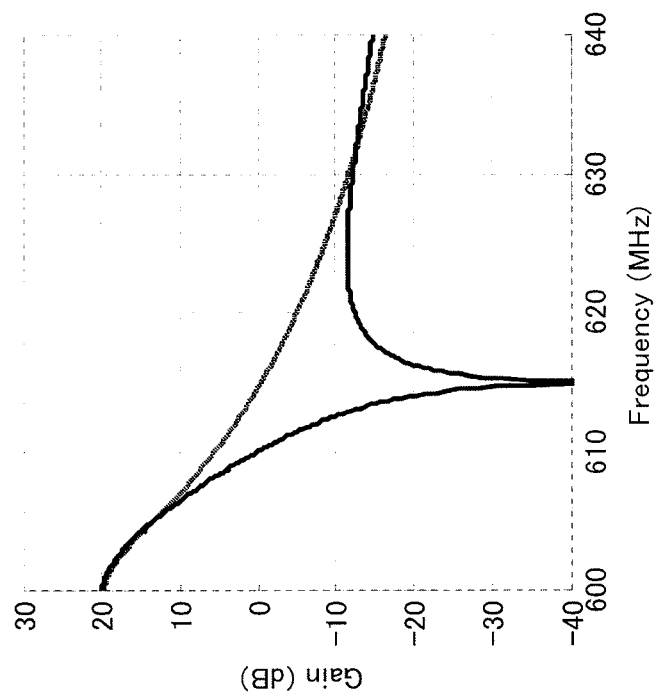

FIG. 9 is examples of frequency characteristics obtained using the above-described method. As compared to conventional first-order IIR characteristics represented by dotted lines, it is understood that, with this method practiced according to the present embodiment, attenuation poles are generated in designated positions and it is possible to realize excellent interfering wave cancellation characteristics. In addition, in FIG. 9, the following values, which are obtained by comparing coefficients in equation 5 calculated from equation 8, with coefficients in equation 9. $f_{LO}$=600 MHz, M=2, $g_m$=29.5 mS, $C_{R1}$=137 fF, $C_{R2}$=41 fF, $C_{R3}$=134 fF, $C_{R21}$=139 fF, $C_{R22}$=139 fF, $C_{B11}$=1.32 pF, $C_{B12}$=500 fF, $C_{B2}$=2 pF.

As described above, according to the configuration and the operation according to the present embodiment, a circuit configuration is adopted in which electrical charge sharing circuit 102-1 and electrical charge sharing circuit 102-2 having different transfer functions are connected in parallel, respective electrical signals obtained in electrical charge sharing circuits 102-1 and 102-2 are weighted and resultant signals are synthesized in buffer capacitor 1033. By this means, it is possible to set attenuation poles for random frequencies at two branches, and consequently it is possible to realize filter characteristics to allow reception of wideband signals.

Although a configuration has been explained as an example in which two electrical charge sharing circuits are arranged in parallel has been shown, another configuration is possible in which three or more circuits are arranged in parallel.

In addition, a case has been explained where electrical charge sharing circuit 102-1 has rotate capacitor units 1021-1 and 1021-2, each having two rotate capacitors 10213 and 10214 connected in parallel, and electrical charge sharing circuit 102-2 has rotate capacitor unit 1025 having three rotate capacitors 10254, 10255 and 10256 connected n parallel, in addition to rotate capacitor units 1021-1 and 1021-2. For example, a configuration is possible in which electrical charge sharing circuit 102-1 has the first rotate capacitor unit having m (m is a positive integer) rotate capacitors connected in parallel and charge sharing circuit 102-2 has the second rotate capacitor unit having n (n is a positive integer different from m) rotate capacitors connected in parallel, in addition to the first rotate capacitor unit).

In this case, it is preferable to input electrical charge to one of m rotate capacitors included in the first rotate capacitor unit and one of n rotate capacitors included in the second rotate capacitor unit at the same timing, and to output, at the same timing, electrical charge from two rotate capacitors to which the electrical charge has been inputted at the same timing.

In addition, although, with the configuration shown in the present embodiment, a case has been assumed for purpose of illustration where local frequency signals LO supplied to sampling switch 1012 are generated in a section other than digital control unit 104 and supplied, the present invention is not limited to this. For example, another configuration is possible in which digital control unit 104 also generates local frequency signals LO and supplies them to sampling switch 1012.

Here, each of history capacitors and rotate capacitors may have a configuration to allow change in the capacitance value. By this configuration, it is possible to control change in bandwidths and control the number of attenuation poles, and therefore it is possible to support adjustment of characteristics, and multiband and multimode. In addition, although, with the configuration shown in the present embodiment, a rotate capacitor is grounded through a reset switch after sharing electrical charge, it is possible to improve gain by holding the electrical charge without grounding. It is possible to reduce the number of switches and control signals, and therefore to simplify the circuit configuration.

Embodiment 2

With the present invention, electrical charge sharing circuits having different transfer functions can reduce unnecessary responses to harmonics to be a problem in a sampling reception scheme.

Figure 10:
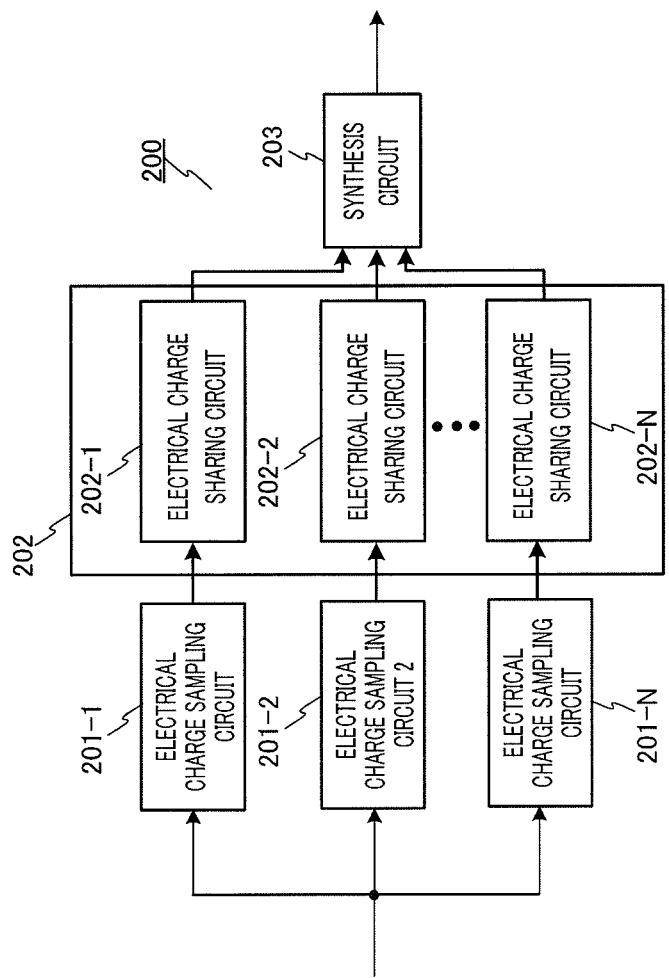
FIG. 10 is a block diagram showing a configuration of a sampling circuit according to Embodiment 2.

In FIG. 10, circuit 200 shows the configuration of a sampling circuit according to the present embodiment on the whole. Electrical charge sampling circuits 201-1 to 201-N perform frequency conversion on received high-frequency signals to obtain baseband signals by switching current signals. Electrical charge sharing circuit group 202 is composed of electrical charge sharing circuits 202-1 to 202-N (N is a natural number equal to or more than 2), each of which has a passive circuit configuration including a switch and a capacitor. Here, transfer functions may be vary between electrical charge sharing circuits 202-1 to 202-N, and outputs from electrical charge sharing circuits 202-1 to 202-N are finally synthesized in synthesis circuit 203, so that it is possible to realize a required filter characteristic.

Here, an example will be explained in which electrical charge sharing circuit 202-1 has the transfer function represented by equation 10, electrical charge sharing circuit 202-2 has the transfer function represented by equation 11, and it is possible to obtain the transfer function represented by equation 12 by synthesizing outputs from electrical charge sharing circuit 202-1 and electrical charge sharing circuit 202-2.

(Equation 10)
$$T_1 = \frac{a_1}{b_1 + 1 - z^{-M}} \quad [11]$$

(Equation 11)
$$T_2 = \frac{a_2}{b_2 + 1 - z^{-M/3}} \quad [12]$$

(Equation 12)
$$T = T_1 - T_2 \quad [13]$$

That is, triple harmonic components are reduced by finding the difference between a branch at the fundamental frequency and a branch operating at an LO frequency three times as high as the fundamental frequency.

Figures 11A, 11B:
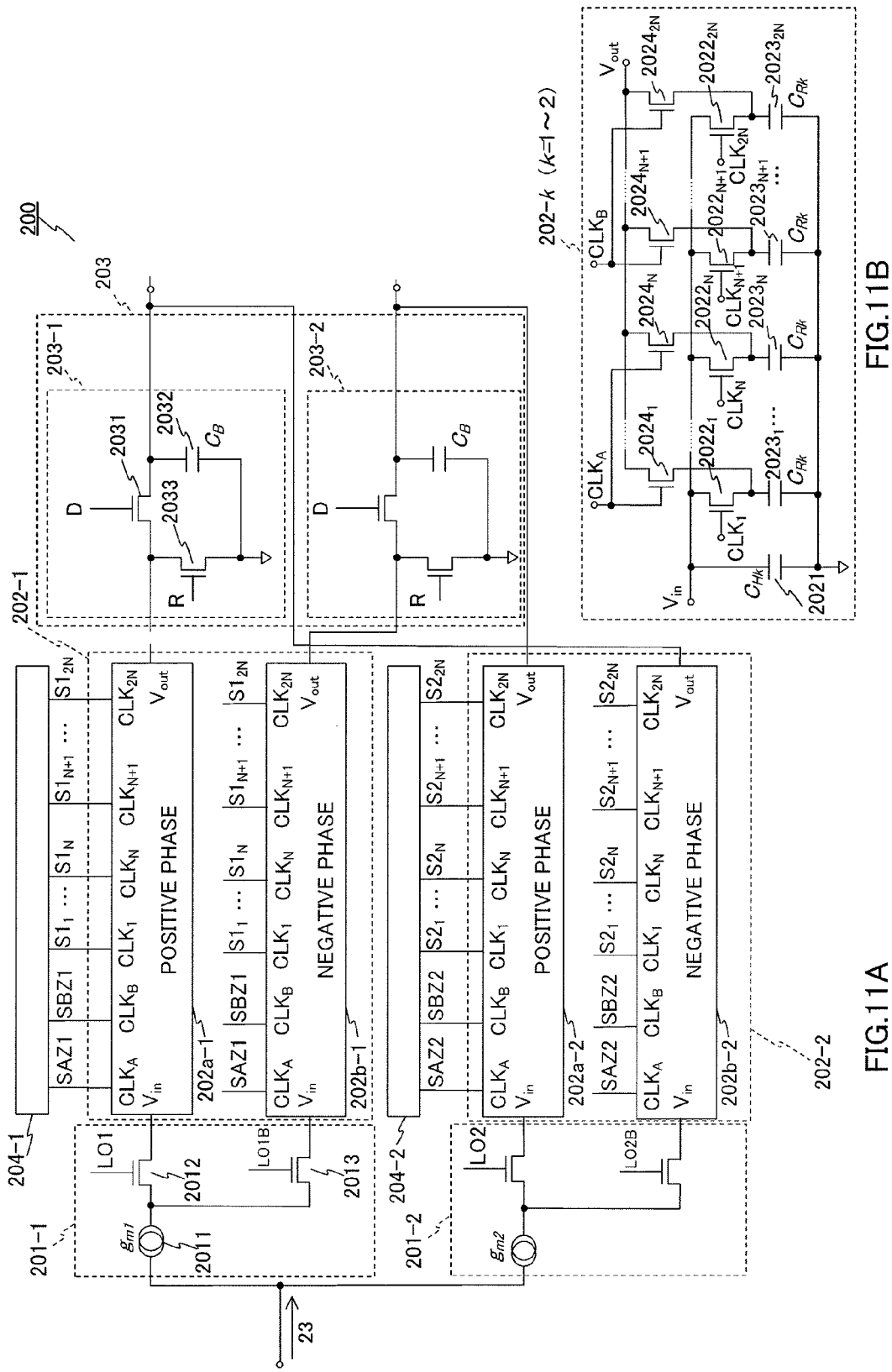
FIG. 11 is a connection diagram showing the configuration of the sampling circuit according to Embodiment 2.

FIG. 11 shows a specific example. As shown in FIG. 11A, it is possible to roughly divide sampling circuit 200 into (1) electrical charge sampling circuits 201-1 and 201-2 (hereinafter collectively referred to as electrical charge sampling circuit 201), (2) electrical charge sharing circuit group 202, (3) synthesis circuit 203 and (4) digital control units 204-k (k=1 to 2).

Here, (1) electrical charge sampling circuit 201, (2) electrical charge sharing unit group 202, (3) synthesis circuit 203 and (4) digital control unit 204-k (k=1 to 2) have the following configurations, respectively.

(1) Electrical charge sampling circuit 201 is composed of TA (transconductance amplifier) 2011, sampling switch 2012 and history capacitor 2013.

(2) Charge sharing circuit group 102 is composed of a plurality of electrical charge sharing circuits 202-1 and 202-2 connected in parallel to the output stage in electrical charge sampling circuit 201. Each of electrical charge sharing circuit 202-k (k=1 to 2) includes positive-phase electrical charge sharing circuit 202a-k and negative-phase electrical charge sharing circuit 202b-k.

(3) Synthesis circuit 203 includes synthesis circuit 203-1 in the positive-phase side and synthesis circuit 203-2 in the negative-phase side. Synthesis circuit 203-k (k=1 to 2) is composed of dump switch 2031, buffer capacitor 2032 and reset switch 2033.

(4) Digital control unit 204-k (k=1 to 2) generates and outputs control signals to each switch to control operation of electrical charge sharing circuit group 202 and synthesis circuit 203.

As shown in electrical charge sharing circuit 202-k (k=1 to 2) in FIG. 11B, each of positive-phase electrical charge sharing circuit 202a-k and negative-phase electrical charge sharing circuit 202b-k included in electrical charge sharing circuit 202-k (k=1 to 2) has history capacitor 2021, integration switches $2022_1$ to $2022_{2N}$, rotate capacitors $2023_1$ to $2023_{2N}$ and release switches $2024_1$ to $2024_{2N}$. Control signals $CLK_1$ to $CLK_{2N}$ are supplied to integration switches $2022_1$ to $2022_{2N}$. Control signal $CLK_A$ are supplied to release switches $2024_1$ to $2024_N$. Control signal $CLK_B$ are supplied to release switches $2024_{N+1}$ to $2024_{2N}$.

Here, the capacitance values of history capacitor 2021 and rotate capacitors $2023_1$ to $2023_{2N}$ in each of electrical charge sharing circuits 202a-1, 202b-1, 202a-2 and 202b-2 are set to provide desired characteristics.

Each of synthesis circuits 203-1 and 203-2 has dump switch 2031, buffer capacitor 2032 and reset switch 2033. Synthesis circuits 203-1 and 203-2 are not necessarily realized with a passive configuration by means of electrical charge sharing using buffer capacitor 2032. Although, in FIG. 11, each of synthesis circuits 203-1 and 203-2 realizes subtraction by switching differential positive-phase and negative-phase signals between input and output, another configuration is possible where, for example, the same number of buffer capacitor 2032 as the number of parallel electrical charge sharing circuits are provided, and signals are outputted by means of an adding circuit using an operational amplifier.

Here, the present invention does not limit what circuit configuration after buffer capacitor 2032 is. For example, a circuit configuration is possible where a discrete signal value defined by the amount of electrical charge accumulated in buffer capacitor 2032 is quantized into a digital value while sampling and holding the discrete signal value as is, and then digital signal processing is performed. In addition, for example, another configuration is possible where a discrete signal value defined by the amount of electrical charge accumulated in buffer capacitor 1031 is converted to a voltage again, and then signal processing is performed.

Digital control unit 204 supplies control signals to $CLK_1$ to $CLK_{2N}$ and $CLK_A$ to $CLK_B$ in electrical charge sharing circuit group 202. Although, in FIG. 11, LOs are inputted apart from digital control unit 204, LOs may be inputted from the digital control unit 204.

Figure 12:
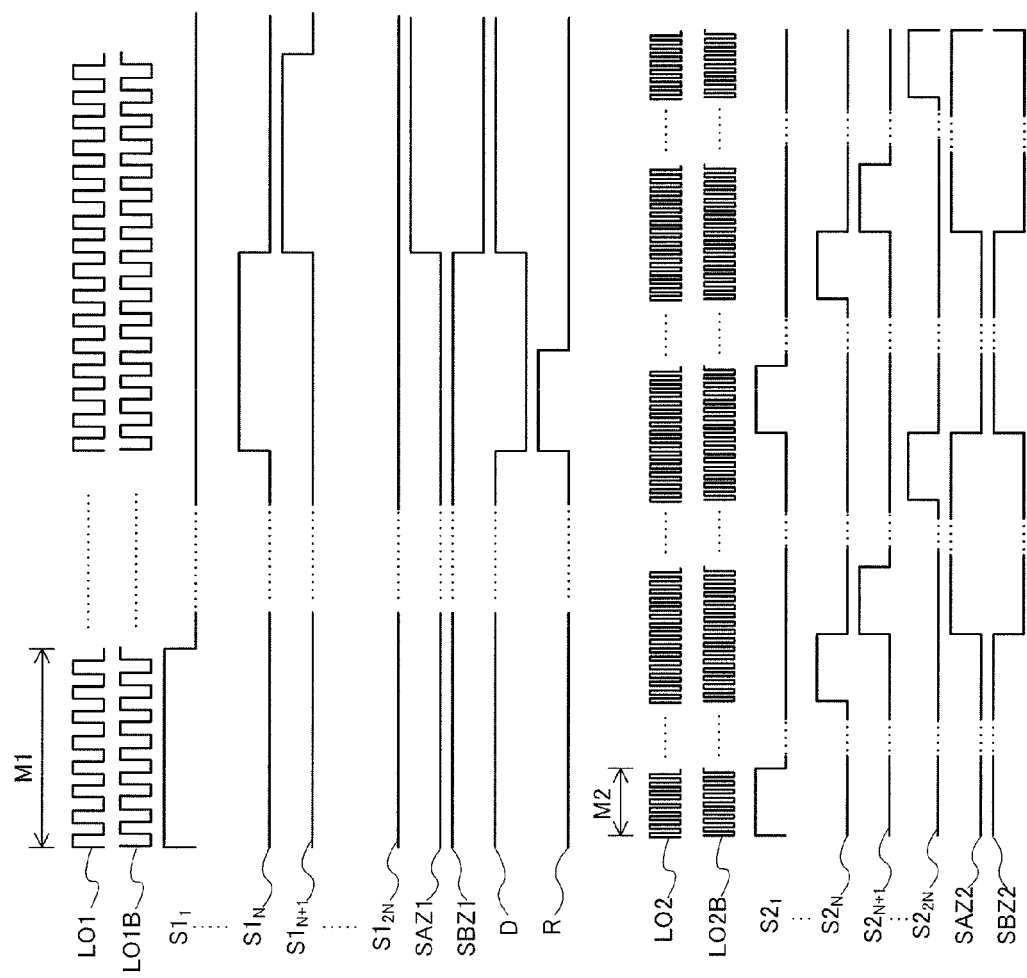
FIG. 12 is a timing chart explaining control signals according to Embodiment 2.

FIG. 12 is a timing chart showing control signals outputted from digital control unit 204 and local frequency signals supplied to sampling switches 2012 and 2013. Control signals $S1_0$ to $S1_{2N}$ have high level periods shifted from each other, and the duration of the high level of each signal matches M1 periods of local frequency signal LO, and also control signals $S2_0$ to $S2_{2N}$ have high level periods shifted from each other, and the duration of the high level of each signal matches M2 periods of local frequency signal LO.

Here, it is important that the frequencies of control signals LO2, LO2B, SAZ2, SBZ2 and $S2_0 \sim S2_{2N}$ supplied to electrical charge sharing circuit 202-2 are three times as high as the frequencies of control signals L01, LO1B, SAZ1, SBZ1 and $S1_0 \sim S1_{2N}$ supplied to electrical charge sharing circuit 202-1, respectively.

Here, with the present embodiment, among the components disclosed in Non-Patent Literature 1, capacitors for feedback control and control signals therefor are not limited to the present invention, and illustrations and descriptions are omitted.

Next, operation of sampling circuit 200 according to the present embodiment will be explained.

TA (transconductance amplifier) 2011 converts inputted analog RF signal 23 to an analog RF current signal. Sampling switches 2012 and 2013 samples the analog RF current signal using local frequency signal 24 having frequencies LO1 and LO1B or LO2 and LO2B. At this time, history capacitor 2021 and rotate capacitor $2023_1$ to $2023_{2N}$ integrate the electrical charge of the sampling signal to form a discrete time signal. Moreover, integration switches $2022_1 \sim 2022_{2N}$ are controlled on and off between history capacitor 2021 and rotate capacitors $2023_1$ to $2023_{2N}$ to perform operation equivalent to FIR filter operation. Here, the FIR filter characteristic is defined by the time length for which each of control signals $S1_1$ to $S1_{2N}$ or each of control signals $S2_1 \sim S2_{2N}$ is in the high level, that is, the time length in which electrical charge integration between history capacitor 2021 and rotate capacitor $2023_1$ to $2023_{2N}$ by electrical charging.

Electrical charge sharing circuits 202a-1, 202b-1, 202a-2 and 202b-2 have the same configuration, but receive different control signals, as input, from digital control units 204-1 and 204-2, and therefore has different transfer functions.

First, operation of electrical charge sharing circuit 202a-1 will be explained.

A discrete time signal is integrated over a period of time longer than the clock length of local frequency signal LO1 in capacitors connected in parallel, including history capacitor 2021 and one of rotate capacitors $2023_1$ to $2023_{2N}$. By this means, filter processing and decimation.

To be more specific, first, integration switch $2022_1$ is turned on by control signal $S1_1$ rotate capacitor $2023_1$ is connected to history capacitor 2021, and electrical charge supplied to the above-described two capacitors is integrated over the periods during control signal $S1_1$ being in a high level period.

When control signal $S1_1$ is low, history capacitor 2021 is disconnected from rotate capacitor $2023_1$ and is connected to rotate capacitor $2023_2$ according to control signal $S1_2$. Rotate capacitor $2023_2$ integrates electrical charge supplied by the current of a discrete signal during control signal $S1_2$ being high, and then disconnects from history capacitor 2021. Likewise, rotate capacitor $2023_3$ to $2023_{2N}$ are connected to history capacitor 2021 in turn during each of M1 periods of a local frequency signal LO, and electrical charge supplied by the current of a discrete signal is integrated in two capacitors.

In this way, by integrating electrical charge supplied by the current of a discrete signal for M1 local frequency signal LO1 periods, it is possible to realize M1-tap FIR filter characteristics. In addition, it is possible to obtain the amount of electrical charge for one sample by integrating a signal for M1 local frequency signal LO1 periods, so that an in crease in the interval between sampled values is M1 times. That is, decimation of sampled values is performed.

In addition, rotate capacitors $2023_3$ to $2023_{2N}$ are connected to history capacitor 2021 in turn to realize an IIR filter characteristic.

Next, release switches $2024_1$ to $2024_N$ are turned on according to control signal SAZ1 to conduct electricity between rotate capacitor $2023_1$ to $2023_N$ and buffer capacitor 2032, so that the electrical charge accumulated in rotate capacitor $2023_1$ to $2023_N$ is shared with buffer capacitor 2032. After the electrical charge sharing between rotate capacitor $2023_1$ to $2023_N$ and buffer capacitor 2032, dump switch 2031 is turned off according to control signal D to cancel the charge sharing state. Next, reset switch 2033 is turned on according to control signal R to reset the electrical charge remaining in rotate capacitor $2023_1$ to $2023_N$ by grounding.

In this way, the electrical charge accumulated in each of rotate capacitor $2023_1$ to $2023_N$ is synthesized in buffer capacitor 2032 to realize N-tap FIR filter characteristics. Discrete time signals for N samples are synthesized and outputted as a discrete time signal for one sample, so that 1/N decimation of the sampling rare is achieved.

Likewise, release switches $2024_{N+1}$ to $2024_{2N}$ are turned on according to control signal SBZ1, and electrical charge is shared between each of rotate capacitors $2023_{N+1}$ to $2023_{2N}$ and buffer capacitor 2032, so that N-tap FIR filter processing and 1/N decimation are performed.

Moreover, a group of rotate capacitors $2023_1$ to $2023_N$ and a group of rotate capacitors $2023_{N+1}$ to $2023_{2N}$ share electrical charge with buffer capacitor in turn to realize IIR filter characteristics.

It is possible to describe the transfer function for a series of electrical charge sampling circuit 201-1 and electrical charge sharing circuit 202-1 (202a-1 or 202b-1) in FIG. 11 as the following equation.

(Equation 13)

$$H_1 = \frac{1-z_1^{-M1}}{1-z_1^{-1}} \cdot \frac{1-z_1^{-N}}{1-z_1^{-1}} \cdot \frac{T_{LO1}}{\pi} \cdot \frac{g_{m1}}{C_{R1}+C_{H1}(1-z_1^{-M1})} \quad [14]$$

Electrical charge sharing circuits 202 (202a-2 or 202b-2) performs the same operation as electrical charge sharing circuit 202-1 on local signal LO2, control signals $S2_1$ to $S2_{2N}$, SAZ2 and SBZ2, and it is possible to describe the transfer function of a series of electrical charge sampling circuit 201-2 and electrical charge sharing circuit 202-2 as the following equation.

(Equation 14)

$$H_2 = \frac{1-z_2^{-M2}}{1-z_2^{-1}} \cdot \frac{1-z_2^{-N}}{1-z_2^{-1}} \cdot \frac{T_{LO2}}{\pi} \cdot \frac{g_{m2}}{C_{R2}+C_{H2}(1-z_2^{-M2})} \quad [15]$$

Here, a configuration is adopted in which subtraction is performed by connecting electrical charge sharing circuit 202-1 and electrical charge sharing circuit 202-2 to synthesis circuit 203 to inverse differential positive-phase and negative-phase signals. Although the subtraction is not simple, because of synthesizing electrical charge at different discrete time intervals, the value approximate to the difference between equation 13 and equation 14 is the output potential, and it is possible to express the whole transfer function as the following.

$$H=H_1-H_2 \quad \text{(Equation 15)}$$

FIG. 13 shows the results of simulation with the circuit simulator in sampling circuit 200 shown in FIG. 11. For this simulation, the following values were used. M=2, N=2, $f_{LO1}$=600 MHz, $g_{m1}$=10 mS, $C_{H1}$=1 pF, $C_{R1}$=200 fF, $f_{LO2}$=1800 MHz, $g_{m2}$=10 mS, $C_{H2}$=$C_{H1}$/6, $C_{R2}$=$C_{R1}$/6, $C_B$=1 pF.

Figure 13B:
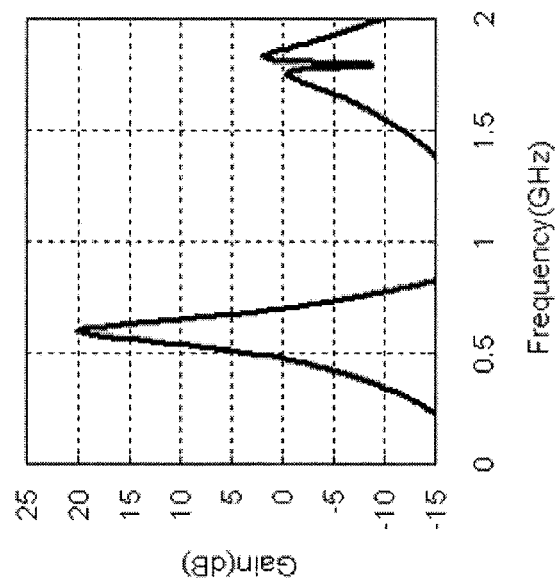
FIG. 13 is a characteristic diagram showing examples of filter characteristics realized according to Embodiment 2.
Figure 13A:
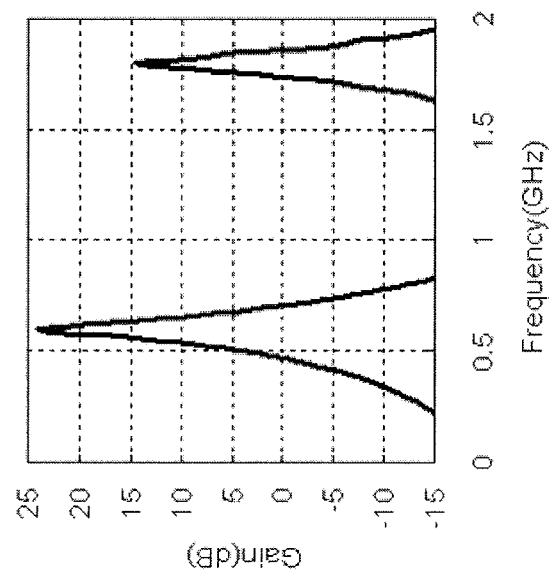

FIG. 13A shows frequency characteristics with the configuration without electrical charge sharing circuit 202-2 (the electrical charge sampling circuits following electrical charge sampling circuit 201-2 are grounded), and FIG. 13B shows the frequency characteristics with the configuration shown in FIG. 11. It is understood that it is possible to reduce triple harmonic response by 12 dB as compared to reduction in fundamental wave gain by 3 dB with the configuration shown in FIG. 11.

As described above, with the configuration and the operation according to the embodiment of the present invention, it is possible to significantly reduce triple harmonic response by adopting a configuration in which electrical charge sharing circuits 202-1 and 202-2 having different transfer functions are connected in parallel, are controlled by different control signals, and have buffer capacitors 2032 to synthesize outputs.

In addition although, with the present embodiment, the configuration is shown in which the second branch clock frequency is three times as high as the first branch clock frequency, this is by no means limiting, it is possible to cancel not only other harmonic responses but also unnecessary signals by changing the second branch clock frequency or adding branches.

Here, a configuration is possible in which the capacitance value of each of history capacitors and the capacitance value of each of rotate capacitors are variable. By adopting this configuration, it is possible to change the gain and bandwidth at each branch and consequently adjust a desired signal gain and the amount of attenuation of unnecessary signals.

In addition, although, with the present embodiment, a configuration is shown where rotate capacitors are grounded through reset switch after electrical charge sharing, it is possible to improve gain by holding electrical charge without grounding. It is possible to reduce the number of switches and control signals to simplify the circuit configuration.

The disclosure of Japanese Patent Application No. 2008-310015, filed on Dec. 4, 2008, including the specification, drawings and abstract, is incorporated herein by reference in its entirety.

INDUSTRIAL APPLICABILITY

The sampling circuit and the receiver according to the present invention are useful for a high-frequency signal processing circuit in the receiving section in a radio communication apparatus and are appropriate for signal frequency conversion and filtering processing.

REFERENCE SIGNS LIST

10 Sampling receiver
13, 100, 200 Sampling circuit
101, 201, 201-1 to 201-N Electrical charge sampling circuit
1011, 2011 Transconductance amplifier (TA)
1012, 2012, 2013 Sampling switch
1013, 2021 History capacitor
102, 202 Electrical charge sharing circuit group
102-1 to 102-N, 202-1 to 202-N Electrical charge sharing circuit
102'-1, 202a-1, 202a-2 Positive-phase electrical charge sharing circuit
102'-2, 202b-1, 202b-2 Negative-phase electrical charge sharing circuit
1021, 1025 Rotate capacitor unit
1022, 1031, 2031 Dump switch
1023, 1032, 2033 Reset switch
1024, 1033 and 2032 Buffer capacitor
10211, 10212, 10251, 10252, 10253, $2022_1$ to $2022_{2N}$ Integration switch
10213, 10214, 10254, 10255, 10256, $2023_1$ to $2023_{2N}$ Rotate capacitor
10215, 10216, 10257, 10258, 10259, $2024_1$ to $2024_{2N}$ Release switch
103, 203 Synthesis circuit
103-1, 203-1 Positive-phase synthesis circuit
103-2, 203-2 Negative-phase synthesis circuit
104, 204, 204-1, 204-2 Digital control unit

The invention claimed is:

1. A sampling circuit, comprising:
an electrical charge sampling circuit that samples an input signal;
a group of electrical charge sharing circuits connected to an output stage of the electrical charge sampling circuit;
a synthesis circuit that is provided in an output side of the group of electrical charge sharing circuits and synthesizes outputs from a plurality of electrical charge sharing circuits; and
a digital controller that outputs control signals to control operation of the group of electrical charge sharing circuits and operation of the synthesis circuit, wherein the group of electrical charge sharing circuits includes:
a first electrical charge sharing circuit having a first rotate capacitor unit having m (m is a positive integer) rotate capacitors; and
a second electrical charge sharing circuit having a second rotate capacitor unit having n (n is a positive integer different from m) rotate capacitors, in addition to the first rotate capacitor unit, the first electrical charge sharing circuit and the second electrical charge sharing circuit having different transfer functions.

2. The sampling circuit according to claim 1, wherein:
one of m rotate capacitors included in the first rotate capacitor unit and one of n rotate capacitors included in the second rotate capacitor unit receive electrical charge, as input, at a same timing; and
two rotate capacitors having received electrical charge, as input, at the same timing, output electrical charge at different timings.

3. The sampling circuit according to claim 1,
wherein electrical charge inputted to a plurality of rotate capacitors included in the first and second rotate capacitors is outputted at different timings between rotate capacitors in one rotate capacitor unit.

4. The sampling circuit according to claim 1, wherein:
the group of electrical charge sharing circuits includes:
a first electrical charge sharing circuit having an infinite impulse response filter characteristic with a zero-order numerator and a first-order denominator; and
a second electrical charge sharing circuit having an infinite impulse response filter characteristic with a first-order numerator and a first-order denominator.

5. The sampling circuit according to claim 1,
wherein each of the plurality of electrical charge sharing circuits has at least two rotate capacitor units each having a plurality of rotate capacitors connected in parallel, and has a dump switch and a buffer capacitor connected between the two rotate capacitor units.

6. The sampling circuit according to claim 1,
wherein at least one of the rotate capacitors included in each of the plurality of electrical charge sharing circuits has a variable capacitance value.

7. The electrical sampling circuit according to claim 1, wherein:
the electrical charge sampling circuit includes:
a transconductance amplifier that converts an input radio frequency signal from a voltage signal to a current signal and outputs the current signal as an radio frequency current signal;
a sampling switch that sample the radio frequency current signal according to an inputted local signal and outputs a result; and
a history capacitor that charges or discharges electrical charge supplied by the radio frequency current signal sampled by the sampling switch.

8. The sampling circuit according to claim 1,
wherein the synthesis circuit is composed of a same number of buffer capacitors as a number of the electrical charge sharing circuits in parallel and an adding circuit using an operational amplifier.

9. A receiver, comprising:
a sampling circuit according to claim 1;
an antenna that receives an input signal; and
an analog-to-digital converting section that converts a baseband signal outputted from a direct sampling circuit from an analog signal to a digital signal, and outputs a digital baseband signal.

10. The sampling circuit according to claim 1, wherein:
the first electrical charge sharing circuit has a plurality of the first rotate capacitor units connected in serial, each of the plurality of the first rotate capacitor units having the m rotate capacitors connected in parallel, and
the second electrical charge sharing circuit has at least the first rotate capacitor unit and the second rotate capacitor unit connected in parallel, the plurality of the first rotate capacitor units being connected in serial and the second rotate capacitor unit having the n rotate capacitors connected in parallel.

* * * * *